United States Patent
Rajalakshmi et al.

(10) Patent No.: US 11,245,388 B2
(45) Date of Patent: Feb. 8, 2022

(54) LEVEL SHIFTER CIRCUITRY USING CURRENT MIRRORS

(71) Applicant: Arm Limited, Cambridge (GB)

(72) Inventors: Navaneeth Narayanan Namboodiri Rajalakshmi, Bangalore (IN); Anil Kumar Baratam, Bangalore (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/740,138

(22) Filed: Jan. 10, 2020

(65) Prior Publication Data
US 2021/0218389 A1 Jul. 15, 2021

(51) Int. Cl.
H03K 19/0175 (2006.01)
H03K 3/356 (2006.01)
H03K 19/0185 (2006.01)

(52) U.S. Cl.
CPC . H03K 3/35613 (2013.01); H03K 19/018528 (2013.01)

(58) Field of Classification Search
CPC ..... H03K 19/018521; H03K 19/00315; H03K 19/018528; H03K 3/356113; H03K 19/018585; H03K 3/35613; H03K 19/0175; H03K 19/017509; H03K 19/0185; H03K 19/018507; H03K 19/018514
See application file for complete search history.

(56) References Cited

U.S. PATENT DOCUMENTS

| | | | |
|---|---|---|---|
| 7,295,038 B2 | 11/2007 | Seo | |
| 7,714,613 B2* | 5/2010 | Mori | H03K 3/356113 326/63 |
| 8,368,425 B2* | 2/2013 | Huang | H03K 3/356182 326/81 |
| 8,680,912 B2 | 3/2014 | Reed | |
| 9,825,634 B2* | 11/2017 | Hong | H03K 19/018507 |
| 10,256,820 B2 | 4/2019 | Duby et al. | |
| 2013/0181762 A1 | 7/2013 | Wu et al. | |
| 2019/0379364 A1 | 12/2019 | Chen et al. | |

OTHER PUBLICATIONS

Labbe, et al.; U.S. Appl. No. 16/130,938; filed Sep. 13, 2018.

* cited by examiner

*Primary Examiner* — Long Nguyen
(74) *Attorney, Agent, or Firm* — Pramudji Law Group PLLC; Ari Pramudji

(57) ABSTRACT

Various implementations described herein may refer to level shifter circuitry using current mirrors. For instance, in one implementation, a level shifter circuit may include a latch circuit configured to receive an input signal, where the latch circuit includes a plurality of transistors configured to generate an output signal based on the input signal. The level shifter circuit may also include a first current mirror circuit coupled to the latch circuit. The level shifter circuit may further include a second current mirror circuit coupled to the latch circuit, where the first current mirror circuit and the second current mirror circuit are configured to drive the output signal from a transient state voltage level to a steady state voltage level.

20 Claims, 8 Drawing Sheets

LEVEL SHIFTER CIRCUITRY USING CURRENT MIRRORS

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some instances, different portions of an integrated circuit may operate at different voltage levels. To convert signals in one voltage domain to signals in another voltage domain, a level shifter circuit may be used. For example, the level shifter circuit may receive an input signal having a voltage level VDDL in a core supply domain, and, in response, the level shifter circuit may generate an output signal having a voltage level VDD in an input/output supply domain. However, the level shifter circuit may fail to translate the input signal properly in some cases, such as when the voltage level VDDL may be low in comparison to threshold voltages of transistors within the level shifter circuit.

BRIEF DESCRIPTION OF THE DRAWINGS

Implementations of various techniques will hereafter be described herein with reference to the accompanying drawings. It should be understood, however that the accompanying drawings illustrate only various implementations described herein and are not meant to limit the scope of various technologies described herein.

DETAILED DESCRIPTION

Various implementations described herein may refer to and may be directed to level shifter circuitry using current mirrors. For instance, in one implementation, a level shifter circuit may include a latch circuit configured to receive an input signal, where the latch circuit includes a plurality of transistors configured to generate an output signal based on the input signal. The level shifter circuit may also include a first current mirror circuit coupled to the latch circuit. The level shifter circuit may further include a second current mirror circuit coupled to the latch circuit, where the first current mirror circuit and the second current mirror circuit are configured to drive the output signal from a transient state voltage level to a steady state voltage level.

Various implementations of level shifter circuitry using current mirrors will now be described in more detail with reference to FIGS. 1-7.

As mentioned earlier, in some implementations, different portions of an integrated circuit (IC) may operate at different voltage levels. For example, the internal core circuits of the IC may operate at a core supply voltage that is lower than an input/output (I/O) supply voltage at which I/O circuits of the IC operate. In such implementations, a level shifter circuit may be used to translate signals between circuits operating at different voltage levels. In particular, the level shifter circuit may be used to convert signals from one voltage domain (e.g., a core supply domain) to signals in another voltage domain (e.g., an I/O supply domain).

Figure 1:
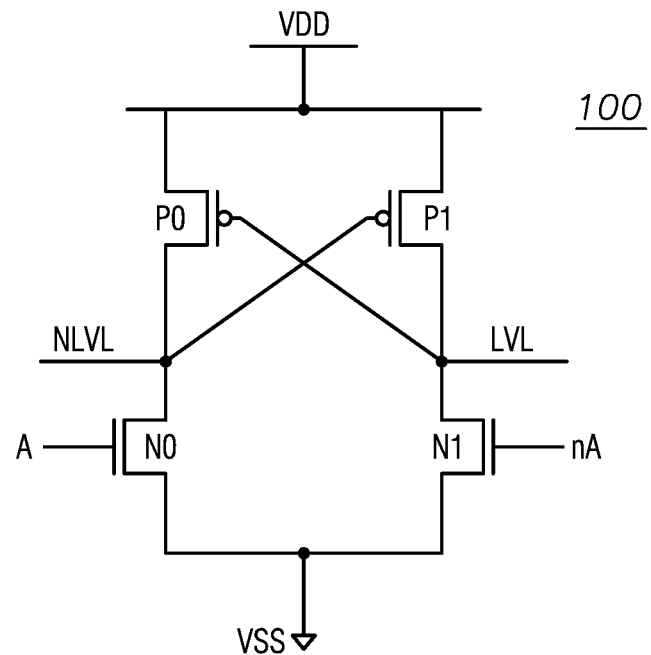
FIG. 1 illustrates a schematic diagram of a conventional level shifter circuit in connection with various implementations described herein.
Figure 1:
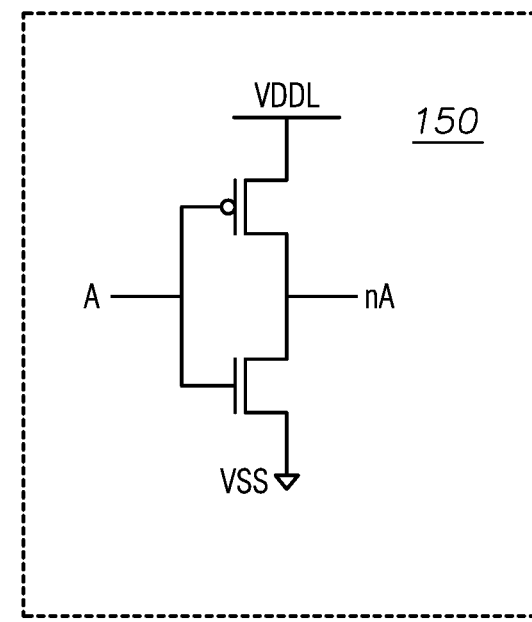

For example, FIG. 1 illustrates a schematic diagram of a conventional level shifter circuit 100 in connection with various implementations described herein. The level shifter circuit 100 may include two pull-up transistors P0, P1 and two pull-down transistors N0, N1. The pull-up transistors may be p-type metal-oxide-semiconductor (PMOS) transistors, whereas the pull-down transistors may be n-type metal-oxide-semiconductor (NMOS) transistors. As shown, the pull-up transistors P0, P1 may be cross-coupled, and the circuit 100 may also be referred to as a cross-coupled latch. As is also shown, a gate terminal of the pull-down transistor N0 may be configured to receive input signal A, and a gate terminal of the pull-down transistor N1 may be configured to receive input signal nA. Further, the input signal A may be inverted via inverter circuit 150 to generate the signal nA, where the signals A, nA may switch between voltage levels VDDL and VSS in the core supply domain. In one implementation, VSS may be a ground voltage.

In response to the input signals A, nA, the level shifter circuit 100 may generate voltage levels in the I/O supply domain at output nodes LVL, NLVL, where the voltage levels may switch between voltage levels VDD and VSS. In particular, in response to a logic high input signal A (i.e., VDDL), the pull-down transistor N0 may pull the voltage level at the node NLVL to VSS (e.g., a ground voltage). The pull-up transistor P1 may then be activated (i.e., switched on), thereby pulling the voltage level at the output node LVL to VDD. In such an implementation, the level shifter circuit 100 may be a level-up shifter circuit, where VDD is a higher voltage level than VDDL. Similarly, in response to a logic low input signal A (i.e., VSS), its complementary input signal nA may activate the pull-down transistor N1, thereby pulling the voltage level at the output node LVL to VSS.

In the conventional level shifter circuit 100, the transistors P0, P1, N0, and N1 may be configured (e.g., via transistor sizing) such that the pull-down transistors N0, N1 are able to overcome the pull-up transistors P0, P1 when the voltage levels at the output nodes LVL, NLVL are to be pulled down to VSS. However, in some instances, the voltage level VDDL of the core supply domain may be lower than the threshold voltage of the pull-down transistors N0, N1. In such instances, the transistors N0, N1 may be operating in sub-threshold, where the pull-down transistors N0, N1 may barely turn on and may no longer be able to overcome the pull-up transistors P0, P1. As such, the level shifter circuit 100 may fail to produce the correct voltage levels at the output nodes LVL, NLVL.

As a result, output signals provided at the output nodes LVL, NLVL may not correctly change in accordance with changes to the input signals A, nA. In particular, prior to a change to the input signals A, nA, the level shifter circuit 100 may initially be at a steady state. In the steady state, the input signal A and the output signal provided at the output node LVL may correctly be at the same logic level. However, if the pull-down transistors of the level shifter circuit 100 are operating in sub-threshold, then the level shifter circuit 100 may move to a transient state in response to a change to the input signal A. In the transient state, the output signal from the node LVL may remain the same despite the change to the input signal A.

Accordingly, the conventional level shifter circuit 100 may not generate the correct output signals at its output nodes LVL, NLVL if the voltage level VDDL of the input signals A, nA is not sufficiently high to allow the pull-down transistors to overcome the pull-up transistors. As such, the conventional level shifter circuit 100 may fail to properly convert signals of a first voltage domain to signals of a second voltage domain unless the voltage level VDDL is increased, which may limit the applicability of the circuit 100 in devices for which reduced power consumption is a priority.

In view of the above, various implementations for a level shifter circuit using current mirrors are described herein. In one or more implementations, the level shifter circuit may be configured to drive voltage levels at output nodes of the circuit to appropriate values, including for implementations where transistors of the circuit may be operating in sub-threshold. In one implementation, a level shifter circuit may include a cross-coupled latch circuit and one or more current mirror circuits, where the one or more current mirror circuits are configured to drive output nodes of the cross-coupled latch circuit from a transient state voltage level to a steady state voltage level, as further explained below.

Figure 2:
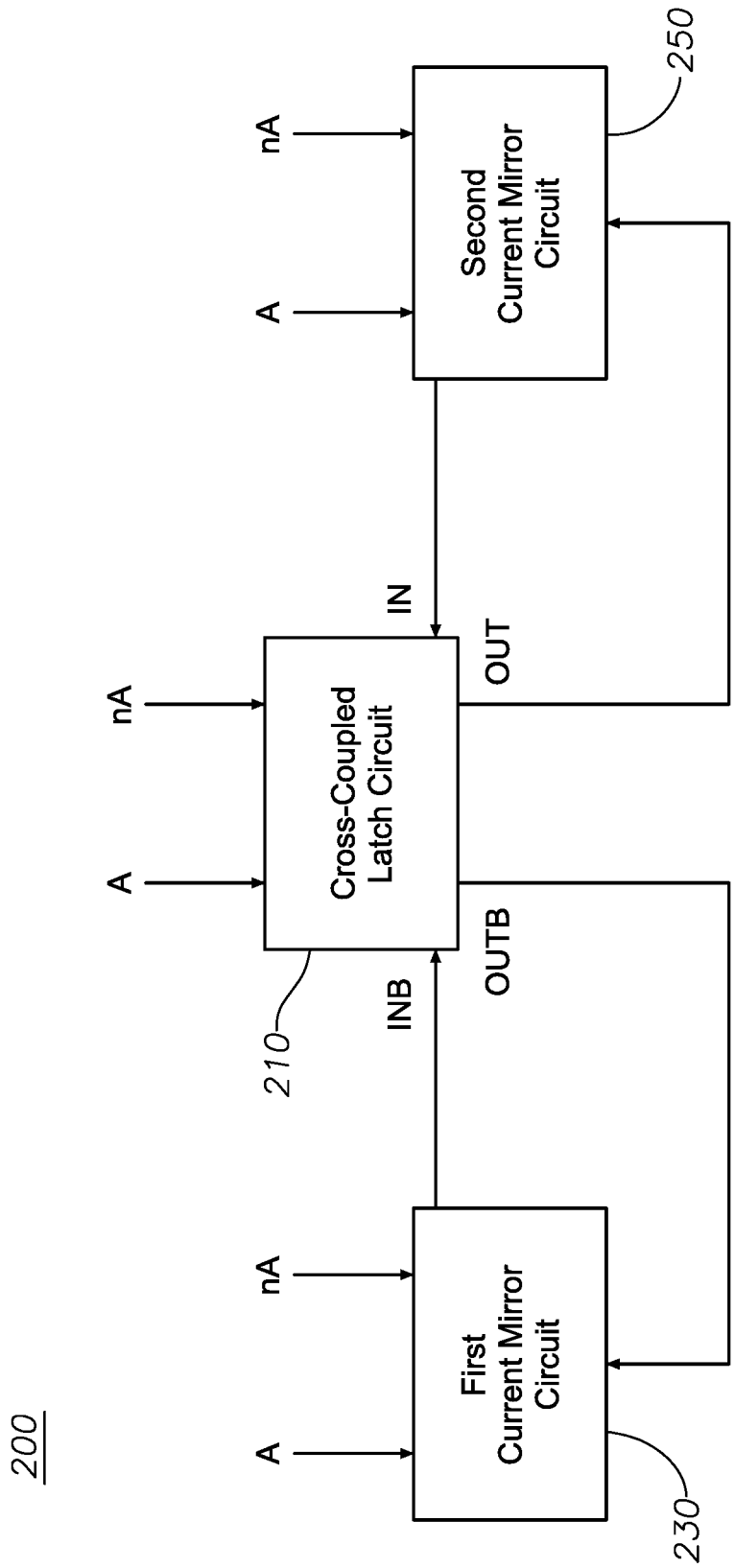
FIG. 2 illustrates a block diagram of a level shifter circuit in accordance with various implementations described herein.

FIG. 2 illustrates a block diagram of a level shifter circuit 200 in accordance with various implementations described herein. As shown, the level shifter circuit 200 may include a cross-coupled latch circuit 210, a first current mirror circuit 230, and a second current mirror circuit 250. In particular, the first current mirror circuit 230 and the second current mirror circuit 250 may each be coupled to the cross-coupled latch circuit 210, as further explained later.

The level shifter circuit 200 may be implemented as an IC, as a discrete circuit, as components on a printed circuit board (PCB), and/or as any other similar type of circuitry. In some implementations, the level shifter circuit 200 may be implemented as a device, apparatus, and the like which may have an IC, components on a PCB, and/or any other type of similar circuitry. Further, in reference to manufacturing and fabrication processes, electronic designers may employ various techniques to design ICs, PCBs, and any other similar circuitry, such as physical chips and/or physical layers, to implement the level shifter circuit 200 and/or techniques thereof.

As shown, the cross-coupled latch circuit 210, the first current mirror circuit 230, and the second current mirror circuit 250 may each be configured to receive input signals A, nA, which may be similar to the input signals A, nA discussed above. Further, as discussed in greater detail later, the first current mirror circuit 230 may be configured to provide a drive input signal INB to the cross-coupled latch circuit 210. Similarly, the second current mirror circuit 250 may be configured to provide a drive input signal IN to the cross-coupled latch circuit 210, where signal INB may be complementary to signal IN. In addition, the cross-coupled latch circuit 210 may be configured to provide output signal OUTB to the first current mirror circuit 230, and the cross-coupled latch circuit 210 may be configured to provide output signal OUT to the second current mirror circuit 250. The output signals OUT, OUTB may be complementary.

Figure 3A:
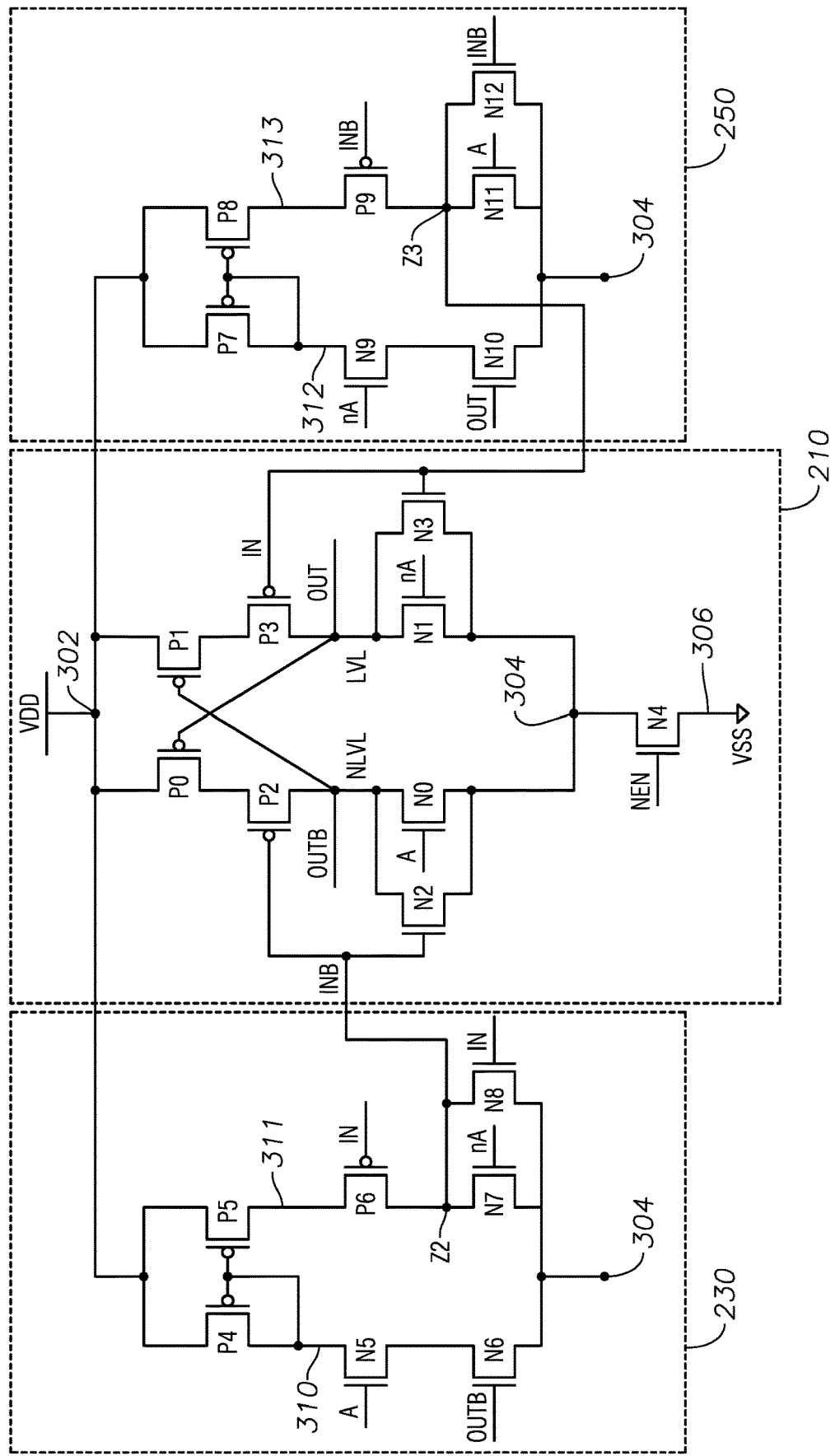
FIGS. 3A-3B illustrate schematic diagrams of a level shifter circuit and associated circuitry in accordance with various implementations described herein.
Figure 3B:
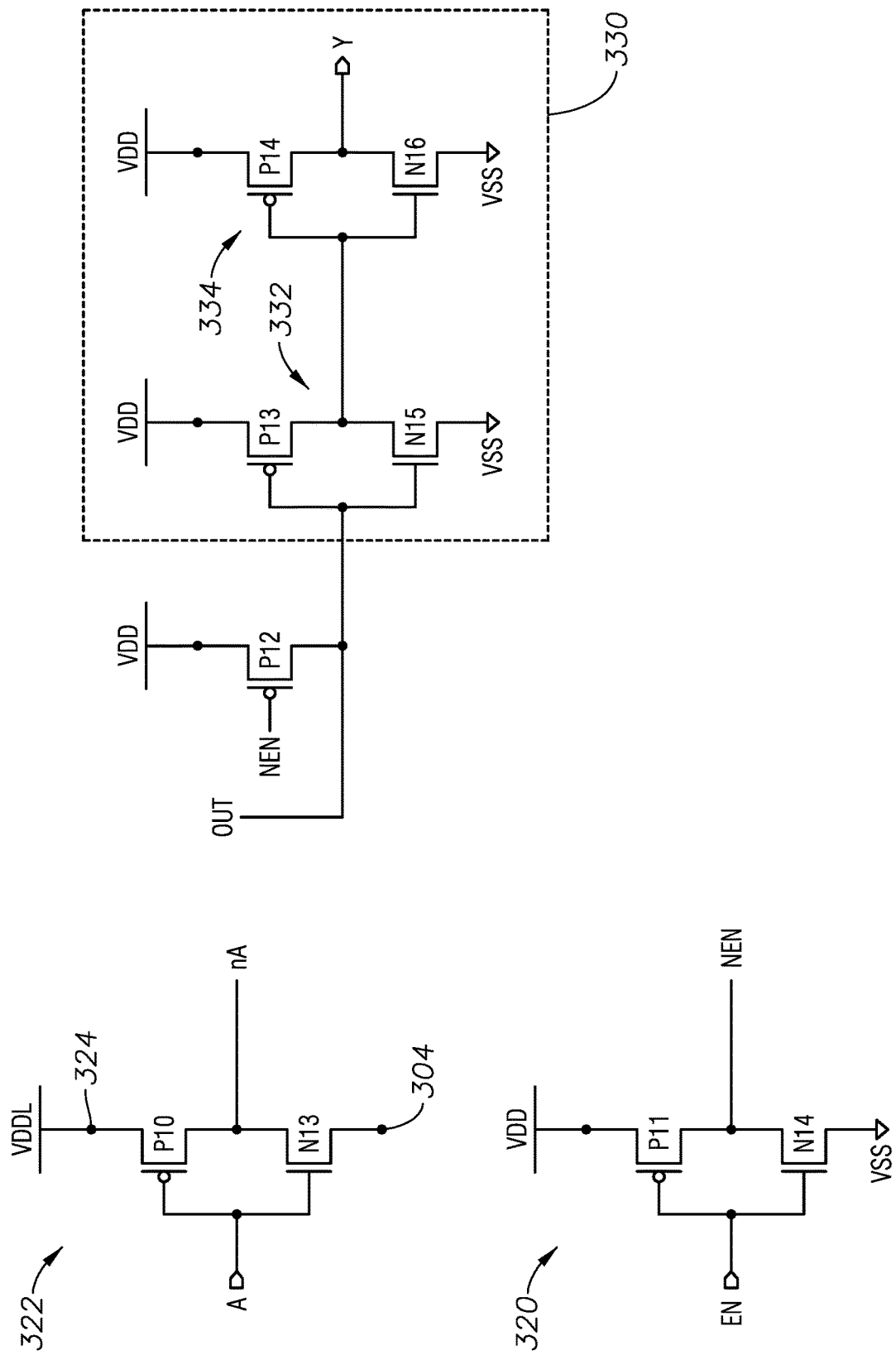

FIGS. 3A-3B illustrate schematic diagrams of the level shifter circuit 200 and associated circuitry in accordance with various implementations described herein. As shown in FIG. 3A, the cross-coupled latch circuit 210 may include pull-up transistors P0, P1, pull-down transistors N0, N1, and drive transistors P2, P3, N2, N3. The pull-up transistors P0, P1 may be similar to those described above, in that the transistors P0, P1 may be PMOS transistors and may be cross-coupled.

In particular, the pull-up transistors P0 and P1 may each have a source terminal coupled to a positive supply voltage node 302, such that the transistors P0 and P1 may receive a power supply voltage at the positive supply voltage node 302. The power supply voltage level provided via the positive supply voltage node 302 may be referred to as VDD.

As also shown, the pull-up transistor P0 may be coupled in series with a drive transistor P2, which may be a PMOS transistor. In particular, a drain terminal of the pull-up transistor P0 may be coupled to a source terminal of the drive transistor P2. Further, a drain terminal of the drive transistor P2 may be coupled to a gate terminal of the pull-up transistor P1 at output node NLVL. Similarly, the pull-up transistor P1 may be coupled in series with a drive transistor P3, which may be a PMOS transistor. In particular, a drain terminal of the pull-up transistor P1 may be coupled to a source terminal of the drive transistor P3. Further, a drain terminal of the drive transistor P3 may be coupled to a gate terminal of the pull-up transistor P0 at output node LVL.

As shown and further explained below, a gate terminal of the drive transistor P2 may be configured to receive the drive input signal INB from the first current mirror circuit 230. Likewise, a gate terminal of the drive transistor P3 may be configured to receive the drive input signal IN from the second current mirror circuit 250.

The pull-down transistors N0, N1 may be similar to those described above, in that the transistors N0, N1 may also be NMOS transistors. As shown, the pull-down transistor N0 may have a drain terminal coupled to the output node NLVL, and the pull-down transistor N1 may have a drain terminal coupled to the output node LVL.

In addition, the pull-down transistors N0, N1 may each have a source terminal coupled to a drain terminal of an enable transistor N4 at reference node 304. As shown, the enable transistor N4 may be an NMOS transistor having a source terminal coupled to a negative supply voltage node 306. The voltage level provided via the negative supply voltage node 306 may be referred to as VSS. In one implementation, VSS may be a ground voltage. As shown, a gate terminal of enable transistor N4 may be configured to receive an enable signal NEN. As shown in FIG. 3B, the enable signal NEN may be generated by inverting an enable signal EN using inverter 320. For purposes of discussing the implementations described herein, it may be assumed that enable transistor N4 is activated via a logic high enable signal NEN, thereby providing voltage level VSS at the reference node 304.

As is also shown in FIG. 3A, a gate terminal of the pull-down transistor N0 may be configured to receive input signal A, and a gate terminal of the pull-down transistor N1 may be configured to receive input signal nA. As similarly discussed above with respect to FIG. 1, the input signal A may be inverted via inverter 322 to generate the input signal nA. As shown in FIG. 3B, a PMOS transistor P10 of the inverter 322 may have a source terminal coupled to a node 324, such that the transistor P10 may receive a power supply voltage at the node 324. The power supply voltage level provided via the node 324 may be referred to as VDDL. Though not shown, a NMOS transistor N13 of the inverter 322 may have a source terminal coupled to a drain terminal of the enable transistor N4 via the reference node 304. As such, the input signals A, nA may be similar to the input signals discussed above, in that the input signals may switch between voltage levels VDDL and VSS.

As also shown in FIG. 3A, the pull-down transistor N0 may be coupled in parallel with a drive transistor N2, which may be a NMOS transistor. In particular, a drain terminal of the pull-down transistor N0 may be coupled to a drain terminal of the drive transistor N2, and a source terminal of the pull-down transistor N0 may be coupled to a source terminal of the driver transistor N2. Further, a gate terminal of the driver transistor N2 may be configured to receive the drive input signal INB from the first current mirror circuit 230.

Similarly, the pull-down transistor N1 may be coupled in parallel with a drive transistor N3, which may be a NMOS transistor. In particular, a drain terminal of the pull-down transistor N1 may be coupled to a drain terminal of the drive transistor N3, and a source terminal of the pull-down transistor N1 may be coupled to a source terminal of the driver transistor N3. Further, a gate terminal of the driver transistor N3 may be configured to receive the drive input signal IN from the second current mirror circuit 250.

In addition, the cross-coupled latch circuit 210 may be configured to provide the output signal OUTB to the first current mirror circuit 230 via the node NLVL. Similarly, the cross-coupled latch circuit 210 may be configured to provide the output signal OUT to the second current mirror circuit 250 via the node LVL. As is also shown in FIG. 3B, the output node LVL may provide the output signal OUT to a drain terminal of a PMOS transistor P12, where the transistor P12 also has a source terminal configured to receive the power supply voltage level VDD. In addition, a gate terminal of the transistor P12 may be configured to receive the enable signal NEN.

The output node LVL may also provide the output signal OUT to an output buffer 330, where the output buffer 330 includes inverters 332 and 334. In particular, the inverter 332 may be configured to receive the output signal OUT at its input, and an input of the inverter 334 may be configured to receive the output of the inverter 332. An output of the inverter 334 may generate an output signal Y, which may correspond to an output signal of the level shifter circuit 200. As shown, the inverters 332, 334 may each have a PMOS transistor with a source terminal configured to receive the power supply voltage level VDD. In addition, as shown, the voltage level VSS may be provided to the NMOS transistors of the inverters 332, 334.

As shown in FIG. 3A, the first current mirror circuit 230 may include a PMOS diode P4 and a PMOS transistor P5. In particular, the PMOS diode P4 may be a PMOS transistor having its gate terminal coupled to its drain terminal. In addition, the gate terminal of the PMOS diode P4 may be coupled to a gate terminal of the PMOS transistor P5. Further, the PMOS diode P4 and the PMOS transistor P5 may each have a source terminal coupled to the positive supply voltage node 302, such that the voltage level VDD may provided to the first current mirror circuit 230.

Additionally, the PMOS diode P4 may be coupled in series with NMOS transistors N5, N6. In particular, the drain terminal of the diode P4 may be coupled to a drain terminal of the transistor N5, and a source terminal of the transistor N5 may be coupled to a drain terminal of the transistor N6. Though not shown, the transistor N6 may have a source terminal coupled to the drain terminal of the enable transistor N4 via the reference node 304. Accordingly, the voltage level VSS may be provided to the first current mirror circuit 230. As shown, the NMOS transistor N5 may have a gate terminal configured to receive the input signal A. In addition, the NMOS transistor N6 may have a gate terminal configured to receive the output signal OUTB from the cross-coupled latch circuit 210 via its output node NLVL.

The PMOS transistor P5 may be coupled in series with a PMOS transistor P6. In particular, a drain terminal of the PMOS transistor P5 may be coupled to a source terminal of the PMOS transistor P6. As shown, a gate terminal of the PMOS transistor P6 may be configured to receive the drive input signal IN from the second current mirror circuit 250.

Further, a drain terminal of the PMOS transistor P6 may be coupled to a drain terminal of a NMOS transistor N7 at a node Z2. In addition, a NMOS transistor N8 may be coupled in parallel with the NMOS transistor N7, where the drain terminals of the transistors N7, N8 are coupled to one another at node Z2, and where the source terminals of the transistors N7, N8 are coupled together. The source terminals of the transistors N7, N8 may also be coupled to the reference node 304. As shown, the first current mirror circuit 230 may be configured to provide the drive input signal INB to the gate terminals of the drive transistors P2 and N2 via the node Z2.

The second current mirror circuit 250 may be similar to the first current mirror circuit 230. The second current mirror circuit 250 may include a PMOS diode P7 and a PMOS transistor P8. In particular, the PMOS diode P7 may be a PMOS transistor having its gate terminal coupled to its drain terminal. In addition, the gate terminal of the PMOS diode P7 may be coupled to a gate terminal of the PMOS transistor P8. Further, the PMOS diode P7 and the PMOS transistor P8 may each have a source terminal coupled to the positive supply voltage node 302, such that the voltage level VDD may provided to the second current mirror circuit 250.

Additionally, the PMOS diode P7 may be coupled in series with NMOS transistors N9, N10. In particular, the drain terminal of the diode P7 may be coupled to a drain terminal of the transistor N9, and a source terminal of the transistor N9 may be coupled to a drain terminal of the transistor N10. Though not shown, the transistor N10 may have a source terminal coupled to the drain terminal of the enable transistor N4 via the reference node 304. Accordingly, the voltage level VSS may be provided to the second current mirror circuit 250. As shown, the NMOS transistor N9 may have a gate terminal configured to receive the input signal nA. In addition, the NMOS transistor N10 may have a gate terminal configured to receive the output signal OUT from the cross-coupled latch circuit 210 via its output node LVL.

The PMOS transistor P8 may be coupled in series with a PMOS transistor P9. In particular, a drain terminal of the PMOS transistor P8 may be coupled to a source terminal of the PMOS transistor P9. As shown, a gate terminal of the PMOS transistor P9 may be configured to receive the drive input signal INB from the first current mirror circuit 230.

Further, a drain terminal of the PMOS transistor P9 may be coupled to a drain terminal of a NMOS transistor N11 at a node Z3. In addition, a NMOS transistor N12 may be coupled in parallel with the NMOS transistor N11, where the drain terminals of the transistors N11, N12 are coupled to one another at node Z3, and where the source terminals of the transistors N11, N12 are coupled together. The source terminals of the transistors N11, N12 may also be coupled to the reference node 304. As shown, the second current mirror circuit 250 may be configured to provide the drive input signal IN to the gate terminals of the drive transistors P3 and N3 via the node Z3.

In operation, the cross-coupled latch circuit 210, the first current mirror circuit 230, and the second current mirror circuit 250 may function together to convert signals from one voltage domain to signals in another voltage domain. In particular, the cross-coupled latch circuit 210, the first current mirror circuit 230, and the second current mirror circuit 250 may be used to convert the input signals A, nA to the output signals OUT, OUTB.

As mentioned above, the input signals A, nA may switch between voltage levels VDDL and VSS of a first voltage domain (e.g., a core supply domain), and the output signals OUT, OUTB may switch between voltage levels VDD and VSS of a second voltage domain (e.g., an I/O supply domain). In some implementations, the voltage level VDDL may be lower than the voltage level VDD. As such, the level shifter circuit 200 may be a level-up shifter circuit configured to translate input signals at a lower voltage level to output signals at a higher voltage level.

As explained above, for conventional level shifter circuits, the pull-down transistors may be operating in sub-threshold due to low voltage levels of the input signals, such that the pull-down transistors may be unable to overcome the pull-up transistors of the circuit. For such circuits, output signals provided at output nodes may not correctly change in accordance with changes to input signals, such that the level shifter circuit may be in a transient state.

For implementations of the level shifter circuit 200 as described herein, the level shifter circuit 200 may similarly transition from a steady state to a transient state in response to changes in logic values of the input signals A, nA. However, in such implementations, the first current mirror circuit 230 and the second current mirror circuit 250 may be used to transition the circuit 200 from the transient state to a steady state once again. In particular, the first current mirror circuit 230 and the second current mirror circuit 250 may be configured to drive the output signals OUT, OUTB from transient state voltage levels to steady state voltage levels.

As similarly described above with respect to FIG. 1, when the level shifter circuit 200 is in the steady state, the input signal A and the output signal OUT may correctly be at the same logic level. In particular, the input signal A may be at a logic high (i.e., at a voltage level VDDL) and the output signal OUT may also be at a logic high (i.e., at a voltage level VDD), or the input signal A may be at a logic low (i.e., at a voltage level VSS) and the output signal OUT may also be at a logic low (i.e., at a voltage level VSS). When the level shifter circuit 200 is in the steady state, voltage levels of the output signals OUT, OUTB may be referred to as steady state voltage levels.

Further, as similarly described above with respect to FIG. 1, when the level shifter circuit 200 is in the transient state, the input signal A and the output signal OUT may incorrectly be at different logic levels. In particular, the input signal A may change to a logic low (i.e., at a voltage level VSS), but the output signal OUT may remain at a logic high (i.e., at a voltage level VDD). Likewise, the input signal A may change to a logic high (i.e., at a voltage level VDDL), but the output signal OUT may remain at a logic low (i.e., at a voltage level VSS). When the level shifter circuit 200 is in the transient state, voltage levels of the output signals OUT, OUTB may be referred to as transient state voltage levels.

By driving the output signals OUT, OUTB from the transient state voltage levels to the steady state voltage levels, the first current mirror circuit 230 and the second current mirror circuit 250 may be able to properly convert the input signals A, nA of a first voltage domain to the output signals OUT, OUTB of a second voltage domain. In one implementation, and as further described in the example below, in response to the input signal A changing to a logic high and the output signal OUT remaining at a logic low (i.e., at a transient state voltage level), the first current mirror circuit 230 may be configured to drive the output signal OUT to a logic high (i.e., to a steady state voltage level). In particular, the first current mirror circuit 230 may drive the output signal OUT to a voltage level VDD by activating one or more transistors of the cross-coupled latch circuit 210 using a mirror current.

In another implementation, and as further described in the example below, in response to the input signal A changing to a logic low and the output signal OUT remaining at a logic high (i.e., at a transient state voltage level), the second current mirror circuit 250 may be configured to drive the output signal OUT to a logic low (i.e., to a steady state voltage level). In particular, the second current mirror circuit 250 may drive the output signal OUT to a voltage level VSS by activating one or more transistors of the cross-coupled latch circuit 210 using a mirror current.

The following example may be used to further describe the operation of the level shifter circuit 200. As noted above, prior to changes in logic values of the input signals A, nA, the level shifter circuit 200 may be in a steady state. In one example, the input signal A may initially be set to a logic high, where the input signal A may be at a voltage level VDDL. In such an example, via the inverter 322, the input signal nA may initially be set to a logic low, where the input signal nA may be at a voltage level VSS. In response to the initial logic high input signal A, the pull-down transistor N0 may pull down the voltage level at the node NLVL to VSS. As such, the pull-up transistor P1 may be turned on, and may be used to pull up the output node LVL to voltage level VDD.

In addition, in response to the initial logic low input signal nA, the second current mirror circuit 250 may be used to turn on the drive transistor P3 of the cross-coupled latch circuit 210, as described below. In particular, the NMOS transistor N9 may be set to an off-state based on the logic low input signal nA. Accordingly, a voltage level at the drain terminal of the PMOS transistor P7 may be equal to the supply voltage level VDD less a threshold voltage level (Vt) of the PMOS diode P7. This voltage level (VDD−Vt) may be applied to the gate terminal of the PMOS transistor P8, thereby leading to the transistor P8 being in an off-state. With the transistor P8 in the off-state, the supply voltage level VDD may be cut off from the node Z3. As such, the drive input signal IN from node Z3 may be at a logic low, thereby leading to the drive transistor P3 being in an on-state and the drive transistor N3 being in an off-state. The activated drive transistor P3 may, along with the activated pull-up transistor P1 mentioned above, also be used to drive the output signal OUT at node LVL to voltage level VDD in response to the initial logic high input signal A.

Further, in response to the initial logic high input signal A, the first current mirror circuit 230 may be used to turn on the drive transistor N2 and to turn off the drive transistor P2. In particular, the NMOS transistor N5 may turn on based on the logic high input signal A. In turn, the voltage level at the gate terminal of PMOS transistor P5 may cause the transistor P5 to also turn on. With the drive input signal IN at a logic low, as explained above, the PMOS transistor P6 may turn on, such that the voltage level at the node Z2 may be equal to the supply voltage level VDD less a threshold voltage level (Vt) of the PMOS transistor P6. As such, the drive input signal INB received from the node Z2 may be at a logic high, thereby turning off the drive transistor P2 and turning on the drive transistor N2. Thus, in response to the initial logic high input signal A, the output node NLVL may be cut off from voltage level VDD, and the node NLVL may be driven to voltage level VSS using the drive transistor N2. Accordingly, in response to the initial logic high input signal A, the drive transistor N2 may be used (along with the pull-down transistor N0, as described above) to turn on the pull-up transistor P1. As noted above, the activated pull-up transistor P1 may be used with the activated drive transistor P3 to drive the output signal OUT at the output node LVL to voltage level VDD.

Thus, in response to the initial logic high input signal A, the first current mirror circuit 230 and the second current mirror circuit 250 may be used to turn on the drive transistors N2, P3, which may be used to drive the voltage level at the output node LVL to the voltage level VDD. As such, the output signal OUT (along with the output signal Y) may be driven to a logic high (i.e., to a steady state voltage level), and the level shifter circuit 200 may be in the above-mentioned steady state.

As mentioned above, the level shifter circuit 200 may transition from a steady state to a transient state in response to changes in logic values of the input signals A, nA. Continuing the same example discussed above, the input signal A may be changed to a logic low, where the input signal A may be at a voltage level VSS. Further, via the inverter 322, the input signal nA may change to a logic high, where the input signal nA may be at a voltage level VDDL.

In response to these changed input signals A, nA, the pull-down transistor N0 may be turned off and the pull-down transistor N1 may be turned on. In some instances, however, the voltage levels at the output nodes LVL, NLVL of the cross-coupled latch circuit 210 may not change immediately in response to the change in logic values of the input signals A, nA. Thus, voltage levels of the output signals OUT, OUTB may be at transient state voltage levels. In particular, the output signal OUT may remain at a logic high (i.e., at the voltage level VDD), and the output signal OUTB may remain at a logic low (i.e., at the voltage level VSS).

As further discussed below, the first current mirror circuit 230 and the second current mirror circuit 250 can be used to drive the output signals OUT, OUTB from transient state voltage levels to steady state voltage levels in response to the change in logic values of the input signals A, nA, thereby transitioning the circuit 200 from the transient state to a steady state once again. In particular, in response to the input signal A changing to a logic low and the output signal OUT remaining at a logic high (i.e., at a transient state voltage level), the second current mirror circuit 250 may be configured to drive the output signal OUT to a logic low (i.e., to a steady state voltage level).

Figure 4:
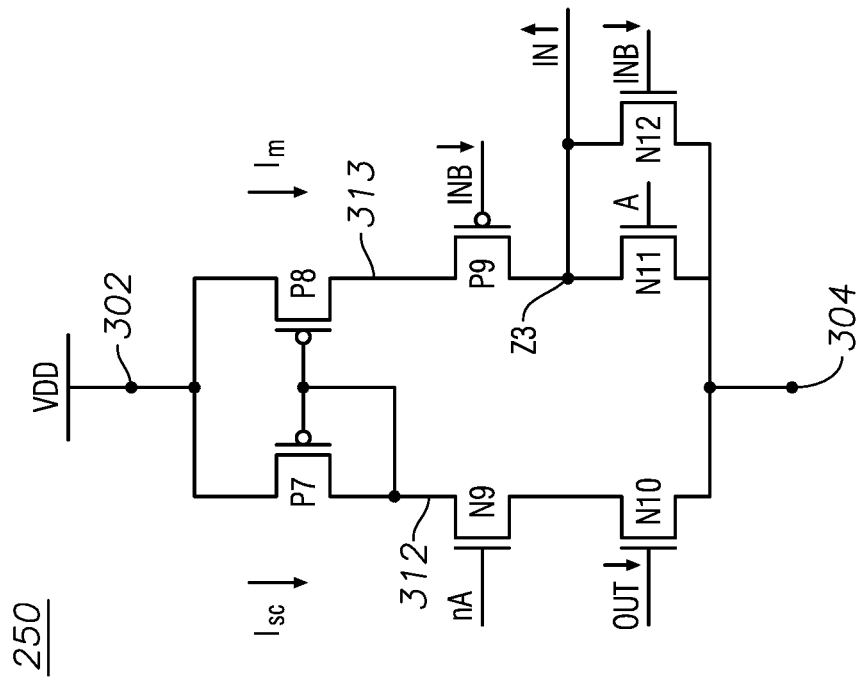
FIG. 4 illustrates a schematic diagram of a first current mirror circuit and a second current mirror circuit in accordance with various implementations described herein.
Figure 4:
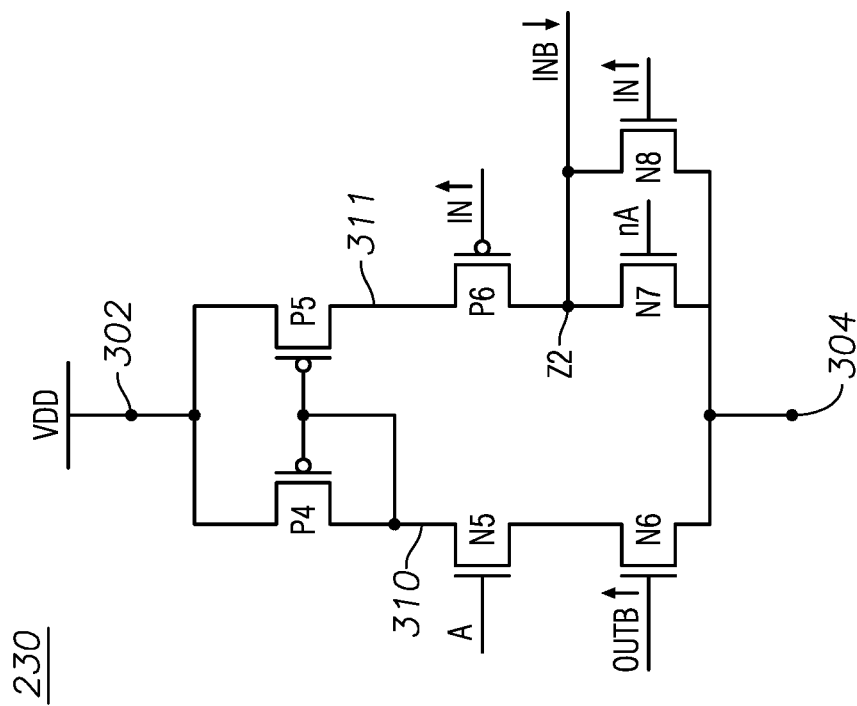

FIG. 4 illustrates a schematic diagram of the first current mirror circuit 230 and the second current mirror circuit 250 in accordance with various implementations described herein. In particular, FIG. 4 illustrates the first current mirror circuit 230 and the second current mirror circuit 250 while the cross-coupled latch circuit 210 (and the level shifter circuit 200) may be in the above-described transient state. An arrow pointing upward next to a signal or node may indicate that the voltage level of the signal or node is increasing as the level shifter circuit 200 transitions from a transient state to a steady state again. Likewise, an arrow pointing downward next to a signal or node may indicate that the voltage level of the signal or node is decreasing as the level shifter circuit 200 transitions from the transient state to the steady state again.

With the input signal A changed to a logic low, the NMOS transistor N5 of the first current mirror circuit 230 may be turned off. Accordingly, a voltage level at the drain terminal of the PMOS diode P4 may be equal to the supply voltage level VDD less a threshold voltage level (Vt) of the PMOS diode P4. This voltage level (VDD−Vt) may be applied to the gate terminal of the PMOS transistor P5, thereby leading to the transistor P5 being in an off-state. With the transistor P5 in the off-state, the supply voltage level VDD may be cut off from the node Z2. As such, the voltage level at the node Z2 may fall to VSS from its previous voltage level (i.e., VDD−Vt). Accordingly, the drive input signal INB received from the node Z2 may have a voltage level that decreases from a logic high in the transient state to a logic low in the steady state, thereby turning on the drive transistor P2 and turning off the drive transistor N2. The drive transistor P2 and the pull-up transistor P0 may be used to drive the output signal OUTB at the node NLVL to the voltage level VDD.

In addition, with the input signal nA changed to a logic high, the NMOS transistor N9 of the second current mirror circuit 250 may be turned on. The NMOS transistor N10 may also be turned on in the transient state, as the output signal OUT may be at a logic high (i.e., at the voltage level VDD). In such conditions, the second current mirror circuit 250 may generate a short circuit current ($I_{SC}$) across branch 312, and the circuit 250 may also generate a mirror current ($I_M$) across branch 313. The short circuit current may be proportional to the mirror current, where the proportionality may be based on sizing of transistors. In some implementations, the mirror current may be larger than the short circuit current.

As noted above, the drive signal INB received from the node Z2 may have a voltage level that decreases from a logic high in the transient state to a logic low in the steady state. Accordingly, as the level shifter circuit 200 progress from the transient state to the steady state, the PMOS transistor P9 may turn on. Once the PMOS transistor P9 turns on, the mirror current may increase the voltage potential across the node Z3 (e.g., from VSS to VDD−Vt). Thus, the drive input signal IN received from the node Z3 may have a voltage level that increases from a logic low in the transient state to a logic high in the steady state, thereby turning off the drive transistor P3 and turning on the drive transistor N3. As such, in this steady state, the output node LVL may be cut off from voltage level VDD, and the output node LVL may be driven to voltage level VSS using the drive transistor N3. Accordingly, in response to the change in value to the logic low for input signal A, the drive transistor N3 may be used (along with the pull-down transistor N1, as described above) to drive the output signal OUT at node LVL to the voltage level VSS.

Thus, in response to the change in value to a logic low for the input signal A and the output signal OUT initially remaining at a logic high (i.e., at a transient state voltage level), the second current mirror circuit 250 may activate the drive transistors N3, P2 using a mirror current, thereby driving the voltage level at the output node LVL to the voltage level VSS. As such, the second current mirror circuit 250 may be used to drive the output signal OUT (along with the output signal Y) to a logic low (i.e., to a steady state voltage level), thereby moving the level shifter circuit 200 to the above-mentioned steady state.

Figure 5:
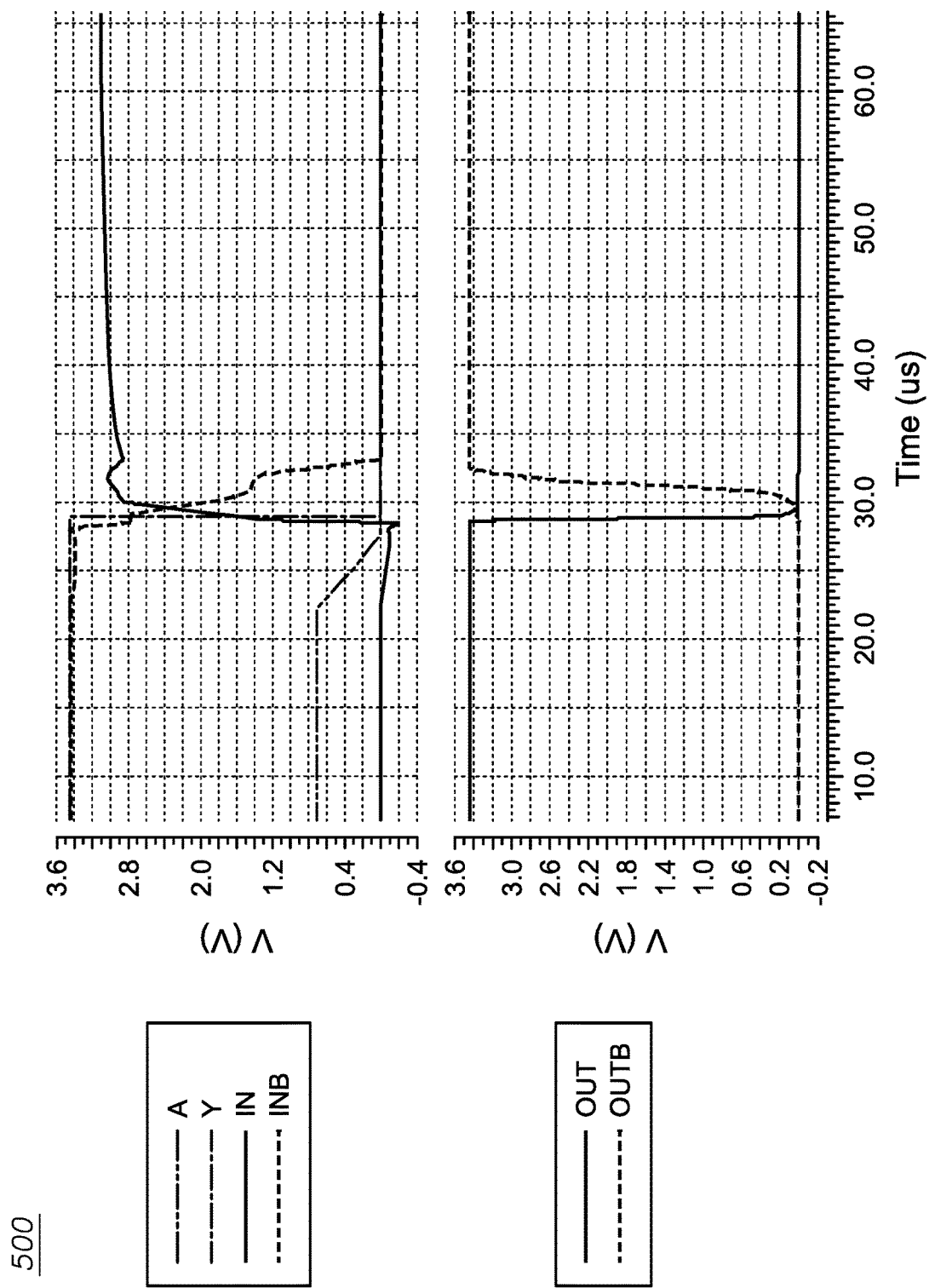
FIG. 5 illustrates a graphical illustration of signal waveforms in accordance with various implementations described herein.

In a further implementation, once the output signal OUT is driven to a logic low in the steady state, the transistor N10 may be deactivated. As such, the second current mirror circuit 250 may cut off, such that it no longer generates the mirror current. In such an implementation, leakage current associated with the second current mirror circuit 250 in the steady state may be minimized. FIG. 5 graphically illustrates signal waveforms corresponding to the level shifter circuit 200 with respect to FIG. 4, where FIG. 5 is discussed in greater detail below.

Further continuing the same example described above, the input signal A may be changed again to a logic high, where the input signal A may be at a voltage level VDDL. In addition, via the inverter 322, the input signal nA may change to a logic low, where the input signal nA may be at a voltage level VSS.

In response to these changed input signals A, nA, the pull-down transistor N0 may be turned on and the pull-down transistor N1 may be turned off. However, as noted above, in some instances the voltage levels at the output nodes LVL, NLVL of the cross-coupled latch circuit 210 may not change immediately in response to the change in logic values of the input signals A, nA. Thus, voltage levels of the output signals OUT, OUTB may be at transient state voltage levels. In particular, the output signal OUT may remain at a logic low (i.e., at the voltage level VSS), and the output signal OUTB may remain at a logic high (i.e., at the voltage level VDD).

As further discussed below, the first current mirror circuit 230 and the second current mirror circuit 250 can be used to drive the output signals OUT, OUTB from these transient state voltage levels to steady state voltage levels in response to the change in logic values of the input signals A, nA, thereby transitioning the circuit 200 from the transient state to a steady state once again. In particular, in response to the input signal A changing to a logic high and the output signal OUT remaining at a logic low (i.e., at a transient state voltage level), the first current mirror circuit 230 may be configured to drive the output signal OUT to a logic high (i.e., to a steady state voltage level).

Figure 6:
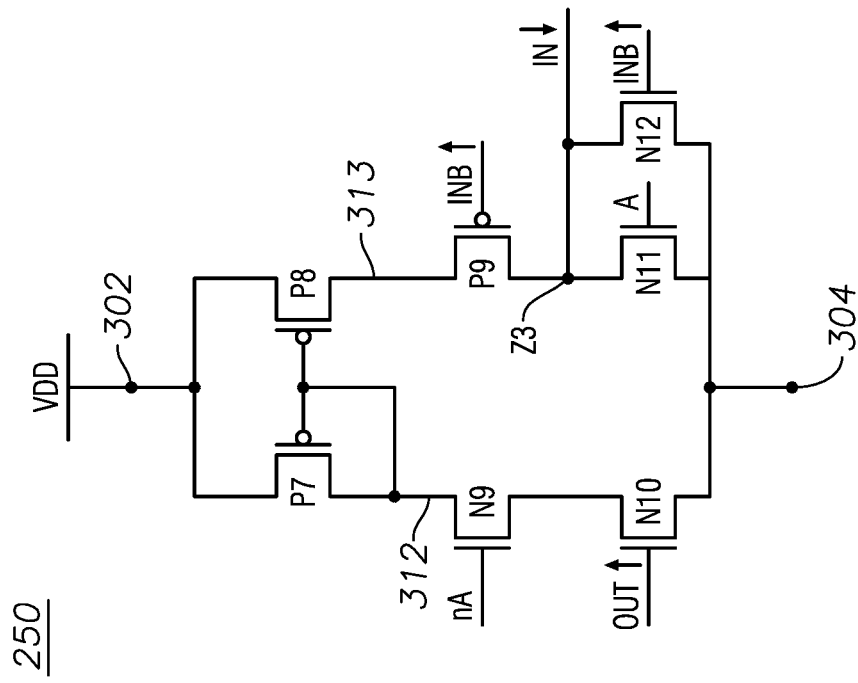
FIG. 6 illustrates a schematic diagram of a first current mirror circuit and a second current mirror circuit in accordance with various implementations described herein.
Figure 6:
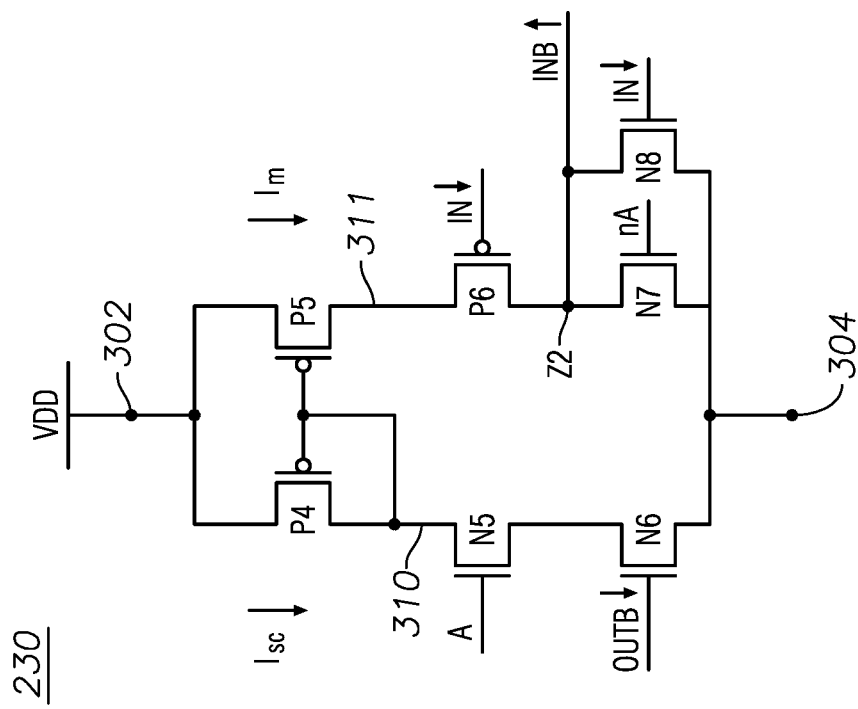

FIG. 6 illustrates a schematic diagram of the first current mirror circuit 230 and the second current mirror circuit 250 in accordance with various implementations described herein. In particular, FIG. 6 illustrates the first current mirror circuit 230 and the second current mirror circuit 250 while the cross-coupled latch circuit 210 (and the level shifter circuit 200) may be in the above-described transient state. An arrow pointing upward next to a signal or node may indicate that the voltage level of the signal or node is increasing as the level shifter circuit 200 transitions from a transient state to a steady state again. Likewise, an arrow pointing downward next to a signal or node may indicate that the voltage level of the signal or node is decreasing as the level shifter circuit 200 transitions from the transient state to the steady state again.

With the input signal nA changed to a logic low, the NMOS transistor N9 of the second current mirror circuit 250 may be turned off. Accordingly, a voltage level at the drain terminal of the PMOS diode P7 may be equal to the supply voltage level VDD less a threshold voltage level (Vt) of the PMOS diode P7. This voltage level (VDD−Vt) may be applied to the gate terminal of the PMOS transistor P8, thereby leading to the transistor P8 being in an off-state.

With the transistor P8 in the off-state, the supply voltage level VDD may be cut off from the node Z3. As such, the voltage level at the node Z3 may fall to VSS from its previous voltage level (i.e., VDD−Vt). Accordingly, the drive input signal IN received from the node Z3 may have a voltage level that decreases from a logic high in the transient state to a logic low in the steady state, thereby turning on the drive transistor P3 and turning off the drive transistor N3. The drive transistor P3 and the pull-up transistor P1 may be used to drive the output signal OUT at the node LVL to the voltage level VDD.

In addition, with the input signal A changed to a logic high, the NMOS transistor N5 of the first current mirror circuit 230 may be turned on. The NMOS transistor N6 may also be turned on in the transient state, as the output signal OUTB may be at a logic high (i.e., at the voltage level VDD). In such conditions, the first current mirror circuit 230 may generate a short circuit current ($I_{SC}$) across branch 310, and the circuit 230 may also generate a mirror current ($I_M$) across branch 311. The short circuit current may be proportional to the mirror current, where the proportionality may be based on sizing of transistors. In some implementations, the mirror current may be larger than the short circuit current.

As noted above, the drive signal IN received from the node Z3 may have a voltage level that decreases from a logic high in the transient state to a logic low in the steady state. Accordingly, as the level shifter circuit 200 progress from the transient state to the steady state, the PMOS transistor P6 may turn on. Once the PMOS transistor P6 turns on, the mirror current may increase the voltage potential across the node Z2 (e.g., from VSS to VDD−Vt). Thus, the drive signal INB received from the node Z2 may have a voltage level that increases from a logic low in the transient state to a logic high in the steady state, thereby turning off the drive transistor P2 and turning on the drive transistor N2. As such, in this steady state, the output node NLVL may be cut off from voltage level VDD, and the output node NLVL may be driven to voltage level VSS using the drive transistor N2. Accordingly, in response to the change in value to the logic low for input signal A, the drive transistor N2 may be used (along with the pull-down transistor N0, as described above) to drive the output signal OUTB at node NLVL to the voltage level VSS. In turn, the pull-up transistor P1 may turn on, and may be used (along with drive transistor P3) to pull up the output node LVL to voltage level VDD.

Thus, in response to the change in value to a logic high for the input signal A and the output signal OUT initially remaining at a logic low (i.e., at a transient state voltage level), the first current mirror circuit 230 may be used to activate the drive transistors N2, P3 using a mirror current, thereby driving the voltage level at the output node LVL to the voltage level VDD. As such, the first current mirror circuit 230 may be used to drive the output signal OUT (along with the output signal Y) to a logic high (i.e., to a steady state voltage level), thereby moving the level shifter circuit 200 to the above-mentioned steady state.

Figure 7:
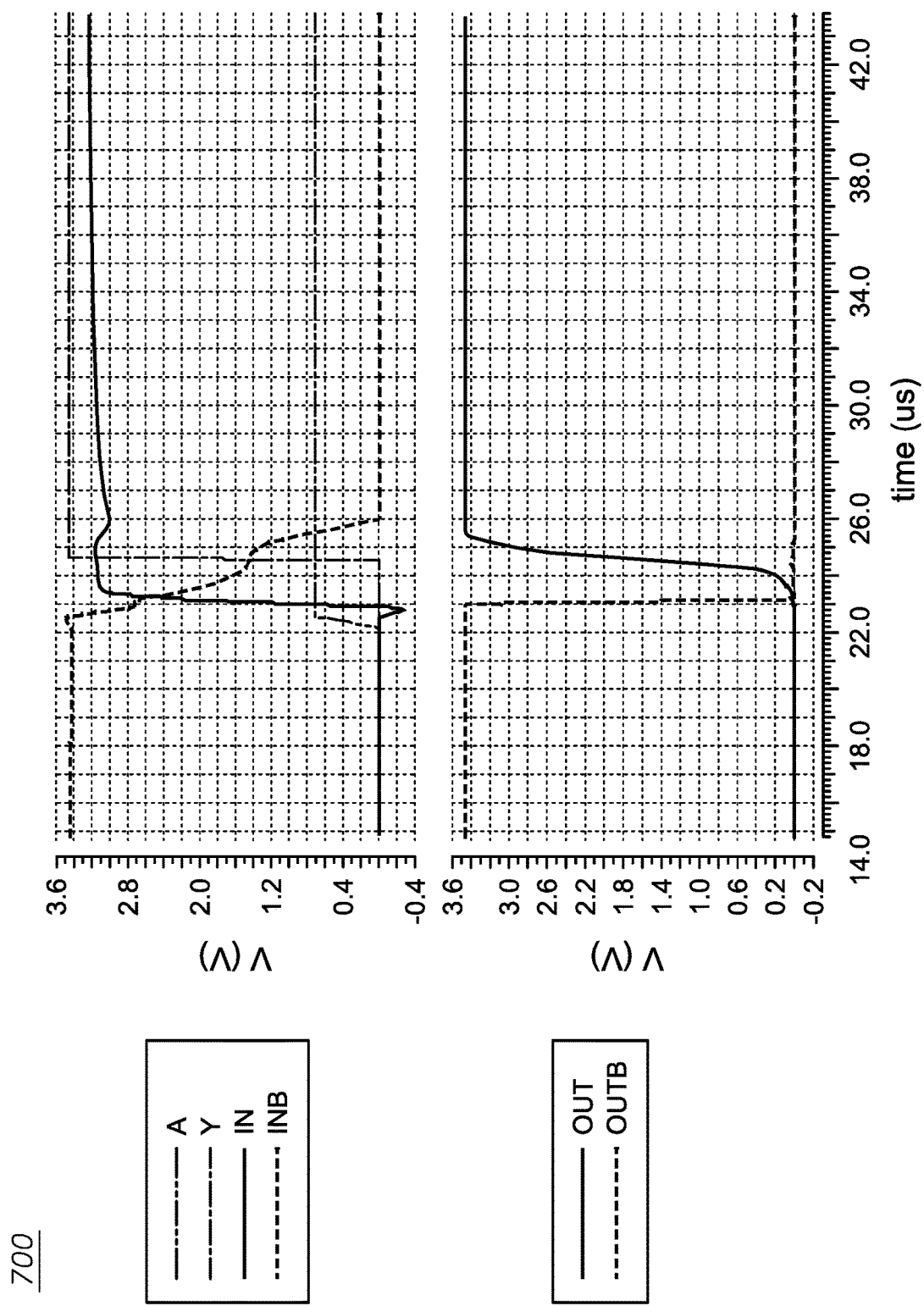
FIG. 7 illustrates a graphical illustration of signal waveforms in accordance with various implementations described herein.

In a further implementation, once the output signal OUT is driven to a logic high in the steady state, the transistor N6 may be deactivated. As such, the first current mirror circuit 230 may cut off, such that it no longer generates the mirror current. In such an implementation, leakage current associated with the first current mirror circuit 230 in the steady state may be minimized. FIG. 7 graphically illustrates signal waveforms corresponding to the level shifter circuit 200 with respect to FIG. 6, where FIG. 7 is discussed in greater detail below.

The level shifter circuit 200 as described herein may be configured to convert signals from one voltage domain to signals in another voltage domain for a variety of voltage levels. As mentioned above, the circuit 200 may operate to convert the input signals A, nA from a first voltage domain to output signals OUT, OUTB from a second voltage domain. As is also noted above, the input signals A, nA may switch between voltage levels VDDL or VSS in the first voltage domain, and the output signals OUT, OUTB may switch between voltage levels VDD or VSS in the second voltage domain.

In some implementations, the voltage level VDDL may be lower than the threshold voltage of the pull-down transistors N0, N1. For example, the voltage level VDDL may be approximately equal to 0.7 V, the threshold voltage may be approximately equal to 1 V, and the voltage level VDD may be approximately equal to 3.3 V. In such instances, the transistors N0, N1 may be operating in sub-threshold. For such implementations, the level shifter circuit 200, with its first current mirror circuit 230 and second current mirror circuit 250, may be able to convert the input signals from a relatively low voltage level VDDL to the voltage level VDD.

For example, FIG. 5 illustrates a graphical illustration 500 of signal waveforms in accordance with various implementations described herein. The signals corresponding to the waveforms in FIG. 5 are those used in the level shifter circuit 200. As shown, the initial input signal A may be a logic high at a voltage level approximately equal to 0.7 V (i.e., VDDL). Accordingly, the first current mirror circuit 230 and the second current mirror circuit 250 may be used to drive the output signals OUT and Y to a logic high at steady state voltage levels approximately equal to 3.3 V (i.e., VDD). As the input signal A changes to a logic low at a voltage level approximately equal to 0 V (i.e., VSS), the first current mirror circuit 230 and the second current mirror circuit 250 may be used to drive the output signals OUT and Y to a logic low at steady state voltage levels approximately equal to 0 V (i.e., VSS).

Similarly, FIG. 7 illustrates a graphical illustration 700 of signal waveforms in accordance with various implementations described herein. The signals corresponding to the waveforms in FIG. 7 are those used in the level shifter circuit 200. As shown, the initial input signal A may be a logic low at a voltage level approximately equal to 0 V (i.e., VSS). Accordingly, the first current mirror circuit 230 and the second current mirror circuit 250 may be used to drive the output signals OUT and Y to a logic low at steady state voltage levels approximately equal to 0 V (i.e., VSS). As the input signal A changes to a logic high at a voltage level approximately equal to 0.7 V (i.e., VDDL), the first current mirror circuit 230 and the second current mirror circuit 250 may be used to drive the output signals OUT and Y to a logic high at steady state voltage levels approximately equal to 3.3 V (i.e., VDD).

Those skilled in the art will understand that various implementations for the cross-coupled latch circuit 210, the first current mirror circuit 230, and the second current mirror circuit 250 may be used, including, but not limited to, the implementations discussed above with respect to FIGS. 1-7. In one implementation, the NMOS transistor N8 and/or the NMOS transistor N12 may be optional. In particular, the inclusion of the transistors N8 and/or N12 may assist with minimizing leakage current in the level shifter circuit 200. In another implementation, the enable transistor N4 at reference node 304 may be optional, such that the cross-coupled latch circuit 210, the first current mirror circuit 230, and the second current mirror circuit 250 may each be coupled to the negative supply voltage node 306 (i.e., VSS). In yet another implementation, an enable transistor may instead be a PMOS transistor coupled to the positive supply voltage node 302 (i.e., VDD), and the cross-coupled latch circuit 210, the first current mirror circuit 230, and the second current mirror circuit 250 may each be coupled to the negative supply voltage node 306 (i.e., VSS). Further, those skilled in the art will understand that the level shifter circuit described herein may be a level-down shifter circuit configured to translate input signals to output signals at a lower voltage level.

Accordingly, in view of the implementations discussed above with respect to FIGS. 1-7, level shifter circuitry using current mirrors may be used to convert signals from one voltage domain to signals in another voltage domain for a variety of voltage levels. As mentioned above, the level shifter circuitry may operate to convert input signals A, nA from a first voltage domain to output signals OUT, OUTB from a second voltage domain. As is also noted above, the input signals A, nA may switch between voltage levels VDDL or VSS in the first voltage domain, and the output signals OUT, OUTB may switch between voltage levels VDD or VSS in the second voltage domain. As described above, the level shifter circuitry with its current mirrors may be able to convert input signals from a relatively low voltage level VDDL to a higher voltage level VDD, including for instances where the voltage level VDDL is lower than the threshold voltages of transistors of the level shifter circuitry.

Further, the current mirrors as described herein may generate mirror currents when level shifter circuitry is in a transient state. When level shifter circuitry is in a steady state, the current mirrors as described herein may be cut off, thereby minimizing leakage current due to the current mirror circuitry. In addition, the level shifter circuitry as described herein may operate within a variety of process, voltage, and temperature (PVT) conditions for power, performance, and area (PPA) and/or process variations. Additionally, the level shifter circuitry as described herein may be smaller in area, operate with less delay, and utilize less power than conventional level shifter circuitry.

The description provided herein may be directed to specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve a developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A level shifter circuit, comprising:
   a latch circuit configured to receive an input signal, wherein the latch circuit comprises a plurality of transistors configured to generate an output signal based on the input signal, and wherein the plurality of transistors comprises a first drive transistor, a second drive transistor, a third drive transistor, and a fourth drive transistor;
   a first current mirror circuit coupled to the latch circuit and configured to generate a first mirror current; and
   a second current mirror circuit coupled to the latch circuit and configured to generate a second mirror current, wherein:
      the first mirror current is configured to deactivate the first drive transistor and to activate the third drive transistor, wherein the deactivated first drive transistor and the activated third drive transistor are configured to drive the output signal from a transient state voltage level to a steady state voltage level; and
      the second mirror current is configured to deactivate the second drive transistor and to activate the fourth drive transistor, wherein the deactivated second drive transistor and the activated fourth drive transistor are configured to drive the output signal from the transient state voltage level to the steady state voltage level.

2. The level shifter circuit of claim 1, wherein the input signal corresponds to a first voltage domain and the output signal corresponds to a second voltage domain, and wherein a voltage level of the input signal at a logic high is less than a voltage level of the output signal at a logic high.

3. The level shifter circuit of claim 1, wherein:
   when the input signal corresponds to a logic high, the transient state voltage level of the output signal corresponds to a logic low and the steady state voltage level of the output signal corresponds to a logic high; and
   when the input signal corresponds to a logic low, the transient state voltage level of the output signal corresponds to a logic high and the steady state voltage level of the output signal corresponds to a logic low.

4. The level shifter circuit of claim 1, wherein the plurality of transistors further comprises:
   a first pull-up transistor and a second pull-up transistor cross-coupled to one another and having terminals configured to receive a voltage from a positive supply voltage node; and
   a first pull-down transistor and a second pull-down transistor having terminals configured to receive a voltage from a negative supply voltage node.

5. The level shifter circuit of claim 4, wherein:
   the first drive transistor is coupled in series with the first pull-up transistor;
   the second drive transistor is coupled in series with the second pull-up transistor;
   the third drive transistor is coupled in parallel with the first pull-down transistor; and
   the fourth drive transistor is coupled in parallel with the second pull-down transistor.

6. The level shifter circuit of claim 4, wherein:
   based on the input signal corresponding to a logic high and the output signal corresponding to the transient state voltage level, the first current mirror circuit is configured to generate the first mirror current;
   based on the input signal corresponding to a logic low and the output signal corresponding to the transient state voltage level, the second current mirror circuit is configured to generate the second mirror current.

7. The level shifter circuit of claim 4, wherein:
   the deactivated first drive transistor and the activated third drive transistor are configured to drive the output signal from the transient state voltage level to the steady state voltage level by activating the second pull-up transistor; and
   the deactivated second drive transistor and the activated fourth drive transistor are configured to drive the output signal from the transient state voltage level to the steady state voltage level using the voltage from the negative supply voltage node.

8. The level shifter circuit of claim 1, wherein the first current mirror circuit comprises:
a first n-type metal-oxide-semiconductor (NMOS) transistor configured to be activated using the input signal; and
a second NMOS transistor configured to be activated using an inverted output signal.

9. The level shifter circuit of claim 1, wherein the second current mirror circuit comprises:
a first n-type metal-oxide-semiconductor (NMOS) transistor configured to be activated using an inverted input signal; and
a second NMOS transistor configured to be activated using the output signal.

10. A level shifter circuit, comprising:
a latch circuit configured to receive an input signal, wherein the latch circuit comprises a plurality of transistors configured to generate an output signal based on the input signal, wherein the plurality of transistors comprises:
a first pull-up transistor and a second pull-up transistor cross-coupled to one another and having terminals configured to receive a voltage from a positive supply voltage node;
a first pull-down transistor and a second pull-down transistor having terminals configured to receive a voltage from a negative supply voltage node; and
a plurality of drive transistors, comprising a first drive transistor, a second drive transistor, a third drive transistor, and a fourth drive transistor;
a first current mirror circuit coupled to the latch circuit; and
a second current mirror circuit coupled to the latch circuit, wherein the first current mirror circuit and the second current mirror circuit are configured to drive the output signal from a transient state voltage level to a steady state voltage level, wherein:
based on the input signal corresponding to a logic high and the output signal corresponding to the transient state voltage level, the first current mirror circuit is configured to generate a mirror current; and
the mirror current is configured to deactivate the first drive transistor and to activate the third drive transistor, and wherein the deactivated first drive transistor and the activated third drive transistor are configured to drive the output signal from the transient state voltage level to the steady state voltage level by activating the second pull-up transistor.

11. The level shifter circuit of claim 10, wherein first current mirror circuit is configured to stop generating the mirror current after the output signal is driven to the steady state voltage level.

12. A level shifter circuit, comprising:
a latch circuit configured to receive an input signal, wherein the latch circuit comprises a plurality of transistors configured to generate an output signal based on the input signal, wherein the plurality of transistors comprises:
a first pull-up transistor and a second pull-up transistor cross-coupled to one another and having terminals configured to receive a voltage from a positive supply voltage node;
a first pull-down transistor and a second pull-down transistor having terminals configured to receive a voltage from a negative supply voltage node; and
a plurality of drive transistors, comprising a first drive transistor, a second drive transistor, a third drive transistor, and a fourth drive transistor;
a first current mirror circuit coupled to the latch circuit; and
a second current mirror circuit coupled to the latch circuit, wherein the first current mirror circuit and the second current mirror circuit are configured to drive the output signal from a transient state voltage level to a steady state voltage level, wherein:
based on the input signal corresponding to a logic low and the output signal corresponding to the transient state voltage level, the second current mirror circuit is configured to generate a mirror current; and
the mirror current is configured to deactivate the second drive transistor and to activate the fourth drive transistor, and wherein the deactivated second drive transistor and the activated fourth drive transistor are configured to drive the output signal from the transient state voltage level to the steady state voltage level using the voltage from the negative supply voltage node.

13. The level shifter circuit of claim 12, wherein second current mirror circuit is configured to stop generating the mirror current after the output signal is driven to the steady state voltage level.

14. A level shifter circuit, comprising:
a latch circuit configured to receive an input signal, wherein the latch circuit comprises a plurality of transistors configured to generate an output signal based on the input signal, the plurality of transistors comprising a plurality of pull-up transistors, a plurality of pull-down transistors, and a plurality of drive transistors, and wherein the plurality of drive transistors comprises a first drive transistor, a second drive transistor, a third drive transistor, and a fourth drive transistor;
a first current mirror circuit coupled to the latch circuit and configured to generate a first mirror current; and
a second current mirror circuit coupled to the latch circuit and configured to generate a second mirror current, wherein the first current mirror circuit and the second current mirror circuit are configured to drive the output signal from a transient state voltage level to a steady state voltage level, wherein:
the first mirror current is configured to deactivate the first drive transistor and to activate the third drive transistor, wherein the deactivated first drive transistor and the activated third drive transistor are configured to drive the output signal from the transient state voltage level to the steady state voltage level by activating a respective pull-up transistor; and
the second mirror current is configured to deactivate the second drive transistor and to activate the fourth drive transistor, wherein the deactivated second drive transistor and the activated fourth drive transistor are configured to drive the output signal from the transient state voltage level to the steady state voltage level using a voltage from a negative supply voltage node.

15. The level shifter circuit of claim 14, wherein:
the plurality of pull-up transistors comprises a first pull-up transistor and a second pull-up transistor cross-coupled to one another and having terminals configured to receive a voltage from a positive supply voltage node, and wherein the respective pull-up transistor corresponds to the second pull-up transistor; and the plurality of pull-down transistors comprises a first pull-down transistor and a second pull-down transistor having terminals configured to receive the voltage from the negative supply voltage node.

16. The level shifter circuit of claim 15, wherein:
based on the input signal corresponding to a logic high and the output signal corresponding to the transient state voltage level, the first current mirror circuit is configured to generate the first mirror current; and
based on the input signal corresponding to a logic low and the output signal corresponding to the transient state voltage level, the second current mirror circuit is configured to generate the second mirror current.

17. A level shifter circuit, comprising:
a latch circuit configured to receive an input signal, wherein the latch circuit comprises a plurality of transistors configured to generate an output signal based on the input signal, the plurality of transistors comprising a plurality of pull-up transistors, a plurality of pull-down transistors, and a plurality of drive transistors, wherein:
  the plurality of pull-up transistors comprises a first pull-up transistor and a second pull-up transistor cross-coupled to one another and having terminals configured to receive a voltage from a positive supply voltage node;
  the plurality of pull-down transistors comprises a first pull-down transistor and a second pull-down transistor having terminals configured to receive a voltage from a negative supply voltage node; and
  the plurality of drive transistors comprises a first drive transistor, a second drive transistor, a third drive transistor, and a fourth drive transistor;
a first current mirror circuit coupled to the latch circuit;
a second current mirror circuit coupled to the latch circuit, wherein the first current mirror circuit and the second current mirror circuit are configured to drive the output signal from a transient state voltage level to a steady state voltage level, wherein:
  based on the input signal corresponding to a logic high and the output signal corresponding to the transient state voltage level, the first current mirror circuit is configured to generate a first mirror current;
  based on the input signal corresponding to a logic low and the output signal corresponding to the transient state voltage level, the second current mirror circuit is configured to generate a second mirror current;
  the first mirror current is configured to deactivate the first drive transistor and to activate the third drive transistor, and wherein the deactivated first drive transistor and the activated third drive transistor are configured to drive the output signal from the transient state voltage level to the steady state voltage level by activating the second pull-up transistor; and
  the second mirror current is configured to deactivate the second drive transistor and to activate the fourth drive transistor, and wherein the deactivated second drive transistor and the activated fourth drive transistor are configured to drive the output signal from the transient state voltage level to the steady state voltage level using the voltage from the negative supply voltage node.

18. A level shifter circuit, comprising:
a latch circuit configured to receive an input signal, wherein the latch circuit comprises a plurality of transistors configured to generate an output signal based on the input signal, wherein the plurality of transistors comprises a pull-up transistor, a first drive transistor, a second drive transistor, a third drive transistor, and a fourth drive transistor;
a first current mirror circuit coupled to the latch circuit; and
a second current mirror circuit coupled to the latch circuit, wherein the first current mirror circuit and the second current mirror circuit are configured to drive the output signal from a transient state voltage level to a steady state voltage level by generating a first mirror current and a second mirror current, wherein:
  the first mirror current is configured to deactivate the first drive transistor and to activate the third drive transistor, wherein the deactivated first drive transistor and the activated third drive transistor are configured to drive the output signal from the transient state voltage level to the steady state voltage level by activating the pull-up transistor; and
  the second mirror current is configured to deactivate the second drive transistor and to activate the fourth drive transistor, wherein the deactivated second drive transistor and the activated fourth drive transistor are configured to drive the output signal from the transient state voltage level to the steady state voltage level using a voltage from a negative supply voltage node.

19. The level shifter circuit of claim 18, wherein:
based on the input signal corresponding to a logic high and the output signal corresponding to the transient state voltage level, the first current mirror circuit is configured to generate the first mirror current; and
based on the input signal corresponding to a logic low and the output signal corresponding to the transient state voltage level, the second current mirror circuit is configured to generate the second mirror current.

20. A level shifter circuit, comprising:
a latch circuit configured to receive an input signal, wherein the latch circuit comprises a plurality of transistors configured to generate an output signal based on the input signal, wherein the plurality of transistors comprises a first drive transistor, a second drive transistor, a third drive transistor, and a fourth drive transistor;
a first current mirror circuit coupled to the latch circuit;
a second current mirror circuit coupled to the latch circuit, wherein the first current mirror circuit and the second current mirror circuit are configured to drive the output signal from a transient state voltage level to a steady state voltage level by generating a first mirror current and a second mirror current, wherein:
  based on the input signal corresponding to a logic high and the output signal corresponding to the transient state voltage level, the first current mirror circuit is configured to generate the first mirror current;
  based on the input signal corresponding to a logic low and the output signal corresponding to the transient state voltage level, the second current mirror circuit is configured to generate the second mirror current;
  the first mirror current is configured to deactivate the first drive transistor and to activate the third drive transistor, and wherein the deactivated first drive transistor and the activated third drive transistor are configured to drive the output signal from the transient state voltage level to the steady state voltage level by activating a pull-up transistor; and
  the second mirror current is configured to deactivate the second drive transistor and to activate the fourth drive transistor, and wherein the deactivated second drive transistor and the activated fourth drive transistor are configured to drive the output signal from the transient state voltage level to the steady state voltage level using a voltage from a negative supply voltage node.

\* \* \* \* \*